(12) United States Patent
Akiyama et al.

(10) Patent No.: US 8,268,700 B2
(45) Date of Patent: Sep. 18, 2012

(54) METHOD FOR MANUFACTURING SOI WAFER

(75) Inventors: Shoji Akiyama, Gunma (JP); Yoshihiro Kubota, Gunma (JP); Atsuo Ito, Gunma (JP); Koichi Tanaka, Gunma (JP); Makoto Kawai, Gunma (JP); Yuuji Tobisaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 372 days.

(21) Appl. No.: 12/153,160

(22) Filed: May 14, 2008

(65) Prior Publication Data

US 2009/0023270 A1    Jan. 22, 2009

(30) Foreign Application Priority Data

May 31, 2007  (JP) ................................. 2007-145624

(51) Int. Cl.
*H01L 21/30* (2006.01)
(52) U.S. Cl. .................. 438/458; 257/E21.568
(58) Field of Classification Search ........... 257/E21.568; 438/458
See application file for complete search history.

(56) References Cited

U.S. PATENT DOCUMENTS

| | | | |
|---|---|---|---|
| 2002/0014407 A1* | 2/2002 | Allen et al. | 204/298.36 |
| 2004/0053515 A1* | 3/2004 | Comita et al. | 438/795 |
| 2004/0171257 A1 | 9/2004 | Neyret et al. | |
| 2006/0014363 A1* | 1/2006 | Daval et al. | 438/455 |
| 2006/0097317 A1* | 5/2006 | Dantz et al. | 257/347 |
| 2006/0172514 A1* | 8/2006 | Gambino et al. | 438/514 |

FOREIGN PATENT DOCUMENTS

| | | |
|---|---|---|
| EP | 1 635 396 A1 | 3/2006 |
| EP | 1 926 139 A2 | 5/2008 |
| JP | A-11-145438 | 5/1999 |
| JP | B2-3048201 | 6/2000 |
| WO | WO 00/63954 A1 | 10/2000 |
| WO | WO 03/005434 A2 | 1/2003 |
| WO | WO 2004/040476 A1 | 5/2004 |

OTHER PUBLICATIONS

A.-J. Auberton-Herve et al.; Smart Cut Technology: Industrial Status of SOI Wafer Production and New Material Developments; Electrochemical Society Proceedings; vol. 99; No. 3; pp. 93-106.
"Science of SOI", Chapter 2. Rearize Corporation. Apr. 19, 2000. A. Matsumura (pp. 7-15); T. Nakai (pp. 16-25); T. Katayama (pp. 26-30); T. Yonehara & K. Sakaguchi (pp. 31-58); N. Tate (pp. 59-66); M. Nakano (pp. 67-74); T. Katayama (pp. 75-78).
European Search Report dated Apr. 20, 2012 in European Patent Application No. 08009380.0.

\* cited by examiner

*Primary Examiner* — Zandra Smith
*Assistant Examiner* — Marvin Payen
(74) *Attorney, Agent, or Firm* — Oliff & Berridge, PLC

(57) ABSTRACT

There is disclosed a method for manufacturing an SOI wafer comprising at least: implanting a hydrogen ion, a rare gas ion, or both the ions into a donor wafer formed of a silicon wafer or a silicon wafer having an oxide film formed on a surface thereof from a surface of the donor wafer, thereby forming an ion implanted layer; performing a plasma activation treatment with respect to at least one of an ion implanted surface of the donor wafer and a surface of a handle wafer, the surface of the handle wafer is to be bonded to the ion implanted surface; closely bonding these surfaces to each other; mechanically delaminating the donor wafer at the ion implanted layer as a boundary and thereby reducing a film thickness thereof to provide an SOI layer, and performing a heat treatment at 600 to 1000° C.; and polishing a surface of the SOI layer for 10 to 50 nm based on chemical mechanical polishing.
A method for manufacturing with excellent productivity an SOI wafer having an SOI layer with a mirror-finished surface and high film thickness uniformity can be provided.

2 Claims, 2 Drawing Sheets

METHOD FOR MANUFACTURING SOI WAFER

BACKGROUND OF THE INVENTION

1. Field of the Invention

The present invention relates to a method for manufacturing an SOI wafer, and more particularly to a method for manufacturing an SOI wafer for bonding two wafers to form a thin-film SOI layer by delamination.

2. Description of the Related Art

To reduce a parasitic capacitance and increase performances of a semiconductor device, a silicon-on-insulator (SOI) wafer having a single-crystal silicon layer formed on an insulator has been widely utilized. In recent years, a demand for a thin-film SOI having an SOI layer (a single-crystal silicon layer on an insulator) of 100 nm or below has been increased to fabricate a complete depletion layer type SOI device. That is because an increase in speed of the device by reducing a film thickness of the SOI layer can be expected.

As one of typical methods for fabricating an SOI wafer, there is an ion implantation delamination method. As one of such methods, there is a Smartout method (a registered trademark). According to this method, a hydrogen ion is implanted into a single-crystal silicon wafer or a single-crystal silicon wafer having an oxide film formed on a surface thereof (a donor wafer), this wafer is bonded to a support wafer (a handle wafer) and then heated to a temperature close to 500° C., the donor wafer is delaminated along a hydrogen ion implanted interface, a single-crystal silicon thin film is transferred to the handle wafer, and polishing the surface roughened due to the delamination is subsequently performed to provide a mirror surface or a heat treatment is subsequently performed at a high temperature (approximately 1100 to 1200° C.) by using an inert gas such as argon or an inert gas having hydrogen added thereto to smooth the surface (see, e.g., Japanese Patent No. 3048201 and Japanese Patent Application Laid-open No. 1999-145438 or A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) pp. 93-106)).

However, this method has several problems. Since delamination of the donor wafer is performed by a heat treatment for generating small cavities called micro cavities on the hydrogen ion implanted interface, relatively large roughening of a surface occurs on the surface after delamination. According to Science of SOI, Chapter 2, Realize corporation, a difference of elevation of approximately 65 nm in terms of Peak to Valley (P-V) occurs even in a very narrow region of 1×1 μm. In light of an entire wafer region, it can be considered that a difference of elevation of 100 nm or above occurs. Therefore, a polishing amount of 100 to 150 nm or above is required in order to polish a surface of the SOI layer to eliminate irregularities on the surface of the SOI layer.

In general, polishing a surface accurately to a target thickness and uniformly in a radial direction is difficult in a polishing process called CMP (chemical mechanical polishing). That is because constantly keeping conditions of a balance in a radial direction of various factors (e.g., a pressure or a supply amount of a slurry) concerning polishing or a polishing pad in a fixed state is difficult. For example, considering a case where an SOI layer having a film thickness of 250 nm immediately after donor wafer delamination is polished to 100 nm, even if unevenness in a radial direction of a polishing stock removal is ±10%, a film thickness of a resultant SOI layer is 85 to 115 nm, thereby leading to a film thickness fluctuation of 30%.

On the other hand, in regard to the method for flattening a surface of an SOI layer based on a heat treatment, a lengthy heat treatment at 1100° C. or above is usually required in order to flatten irregularities on the surface of the SOI layer based on the heat treatment. Adding the heat treatment results in occurrence of a problem of, e.g., management of contamination due to a high-temperature process, an increase in cost, or a reduction in productivity. Further, in case of a substrate other than that formed of single-crystal silicon, e.g., a quartz substrate, a glass-transition temperature is near 1050° C., and flattening the surface based on a high-temperature heat treatment may be difficult. Therefore, this method is not desirable.

SUMMARY OF THE INVENTION

The present invention was accomplished in view of the aforementioned problems, it is an object of the present invention to provide a method for manufacturing with excellent productivity an SOI wafer having an SOI layer with a mirror-finished surface and high film thickness uniformity.

To achieve this object, according to the present invention, there is provided a method for manufacturing an SOI wafer comprising at least: implanting a hydrogen ion, a rare gas ion, or both the ions into a donor wafer formed of a silicon wafer or a silicon wafer having an oxide film formed on a surface thereof from a surface of the donor wafer, thereby forming an ion implanted layer; performing a plasma activation treatment with respect to at least one of an ion implanted surface of the donor wafer and a surface of a handle wafer, the surface of the handle wafer is to be bonded to the ion implanted surface; closely bonding the ion implanted surface of the donor wafer to the surface of the handle wafer; mechanically delaminating the donor wafer at the ion implanted layer as a boundary and thereby reducing a film thickness thereof to provide an SOI layer, and performing a heat treatment at 600 to 1000° C.; and polishing a surface of the SOI layer for 10 to 50 nm based on chemical mechanical polishing.

As above mentioned, when manufacturing the SOI wafer, since a film thickness of the donor wafer is reduced by mechanically delaminating the donor wafer, at the ion implanted layer as a boundary formed by implanting the hydrogen ion, the rare gas ion, or both the ions into the donor wafer from the surface thereof, to provide the SOI layer, roughness of a surface (a difference of elevation) of the SOI layer immediately after this delamination can be set to 50 nm or below. That is, the SOI layer having a relatively smooth surface can be obtained even immediately after delamination, and the surface roughness immediately after delamination can be reduced as compared with that in an example where delamination is carried out based on a heat treatment like the Smartcut method. Therefore, a polishing stock removal in subsequent chemical mechanical polishing can be minimized.

Then, the heat treatment is performed to reduce a damage due to ion implantation in the SOI layer immediately after delamination. At this time, setting a heat treatment temperature to 600° C. or above enables improving the damage due to ion implantation. Furthermore, setting the same to 1000° C. or below enables avoiding contamination of a heavy metal from the inside of a furnace due to a high temperature and reducing a cost that is beyond necessity.

Contrary, when the heat treatment temperature is less than 600° C., the damage due to ion implantation in the SOI layer immediately after delamination cannot be sufficiently improved, and thereby a defect occurs, resulting in degradation in device characteristics. Moreover, when the heat treatment temperature exceeds 1000° C., metal contamination occurs in the SOI wafer, leading to a factor of increasing a cost.

Additionally, then, the surface of the SOI layer is polished based on chemical mechanical polishing. As explained above, according to the present invention, since the donor wafer is mechanically delaminated to obtain the SOI layer and roughness of the surface of the SOI layer immediately after delamination is relatively smooth, polishing the surface for an amount corresponding to a thickness of only 10 to 50 nm enables sufficiently mirror-polishing the surface of the SOI layer, thereby finishing this surface to a mirror surface level equivalent to that of a regular polished wafer. Further, setting a polishing stock removal to 50 nm or below prevents unevenness in film thickness of the SOI layer from being degraded due to polishing. Therefore, the SOI wafer having high film thickness uniformity of the SOI layer can be finally obtained.

Contrary, realization of the mirror-finished surface of the SOI layer becomes insufficient when the polishing stock removal is less than 10 nm, and excellent film thickness uniformity of the SOI layer cannot be obtained when polishing is effected beyond 50 nm.

As explained above, according to the method for manufacturing an SOI wafer of the present invention, when manufacturing the SOI wafer, since a reduction in film thickness of the donor wafer to provide the SOI layer is performed based on mechanical delamination, the heat treatment at 600 to 1000° C., and chemical mechanical polishing with respect to the surface of the SOI layer for 10 to 50 nm, the SOI wafer in which the SOI layer has a uniform film thickness and has a mirror-finished surface can be obtained with high productivity and less cost.

Furthermore, according to the present invention, there is provided a method for manufacturing an SOI wafer comprising at least: implanting a hydrogen ion, a rare gas ion, or both the ions into a donor wafer formed of a silicon wafer or a silicon wafer having an oxide film formed on a surface thereof from a surface of the donor wafer, thereby forming an ion implanted layer; performing a plasma activation treatment with respect to at least one of an ion implanted surface of the donor wafer and a surface of a handle wafer, the surface of the handle wafer is to be bonded to the ion implanted surface; closely bonding the ion implanted surface of the donor wafer to the surface of the handle wafer; mechanically delaminating the donor wafer at the ion implanted layer as a boundary and thereby reducing a film thickness thereof to provide an SOI layer, and performing a heat treatment at 600 to 1000° C.; and etching a surface of the SOI layer for 10 to 50 nm based on a GCIB processing.

As above mentioned, when manufacturing the SOI wafer, since a film thickness of the donor wafer is reduced by mechanically delaminating the donor wafer to provide the SOI layer, the surface of the SOI layer immediately after this delamination is relatively smooth, and an etching stock removal in the subsequent GCIB processing can be minimized.

Moreover, the heat treatment at 600 to 1000° C. enables avoiding metal contamination due to a high temperature and improving an ion implantation damage in the SOI layer immediately after delamination without increasing a cost.

Additionally, since the surface of the SOI layer is etched for 10 to 50 nm based on the GCIB (Gas Cluster Ion Beam) treatment, the surface of the SOI layer can be mirror-finished, and unevenness in film thickness can be prevented from being degraded, thereby manufacturing the SOI wafer having high film thickness uniformity of the SOI layer.

At this time, the surface of the SOI layer after the GCIB processing can be polished for 10 to 30 nm based on chemical mechanical polishing.

The surface of the SOI layer after the GCIB processing can be polished for 10 to 30 nm based on chemical mechanical polishing in this manner, thereby facilitating mirror finish of the surface of the SOI layer.

At this time, the handle wafer can be any one of a silicon wafer, a silicon wafer having an oxide film formed on a surface thereof, a quartz wafer, a glass wafer, an alumina (sapphire) wafer, a SiC wafer, and an aluminum nitride wafer.

The handle wafer used in the present invention can be appropriately selected from these wafers in accordance with an object of a semiconductor device to be fabricated.

Furthermore, it is preferable that the ion implanted surface of the donor wafer is closely bonded to the surface of the handle wafer, then a heat treatment is performed at 400° C. or below, and the donor wafer is mechanically delaminated at the ion implanted layer as a boundary.

When the donor wafer is bonded to the handle wafer and then the heat treatment at 400° C. or below is carried out to thereafter mechanically delaminate the donor wafer in this manner, bonding strength of the donor wafer and the handle wafer can be increased, and occurrence of a failure when delaminating the donor wafer can be reduced.

Moreover, an RMS value indicative of a surface roughness of the SOI layer after the chemical mechanical polishing or the GCIB processing can be set to 0.5 nm or below.

As explained above, according to the method for manufacturing an SOI wafer of the present invention, an RMS value indicative of a surface roughness of the SOI layer after chemical mechanical polishing or the GCIB processing can be set to 0.5 nm or below, and the surface of the SOI layer can be finished to a mirror surface level equivalent to that of a regular polished wafer.

According to the method for manufacturing an SOI wafer of the present invention, a damage due to ion implantation can be removed, the surface can be mirror-finished, and the high-quality SOI wafer having the SOI layer superior in film thickness uniformity can be manufactured with excellent productivity.

DETAILED DESCRIPTION OF THE PREFERRED EMBODIMENTS

Although an embodiment according to the present invention will now be explained hereinafter with reference to the accompanying drawings, the present invention is not restricted thereto.

Figure 1:
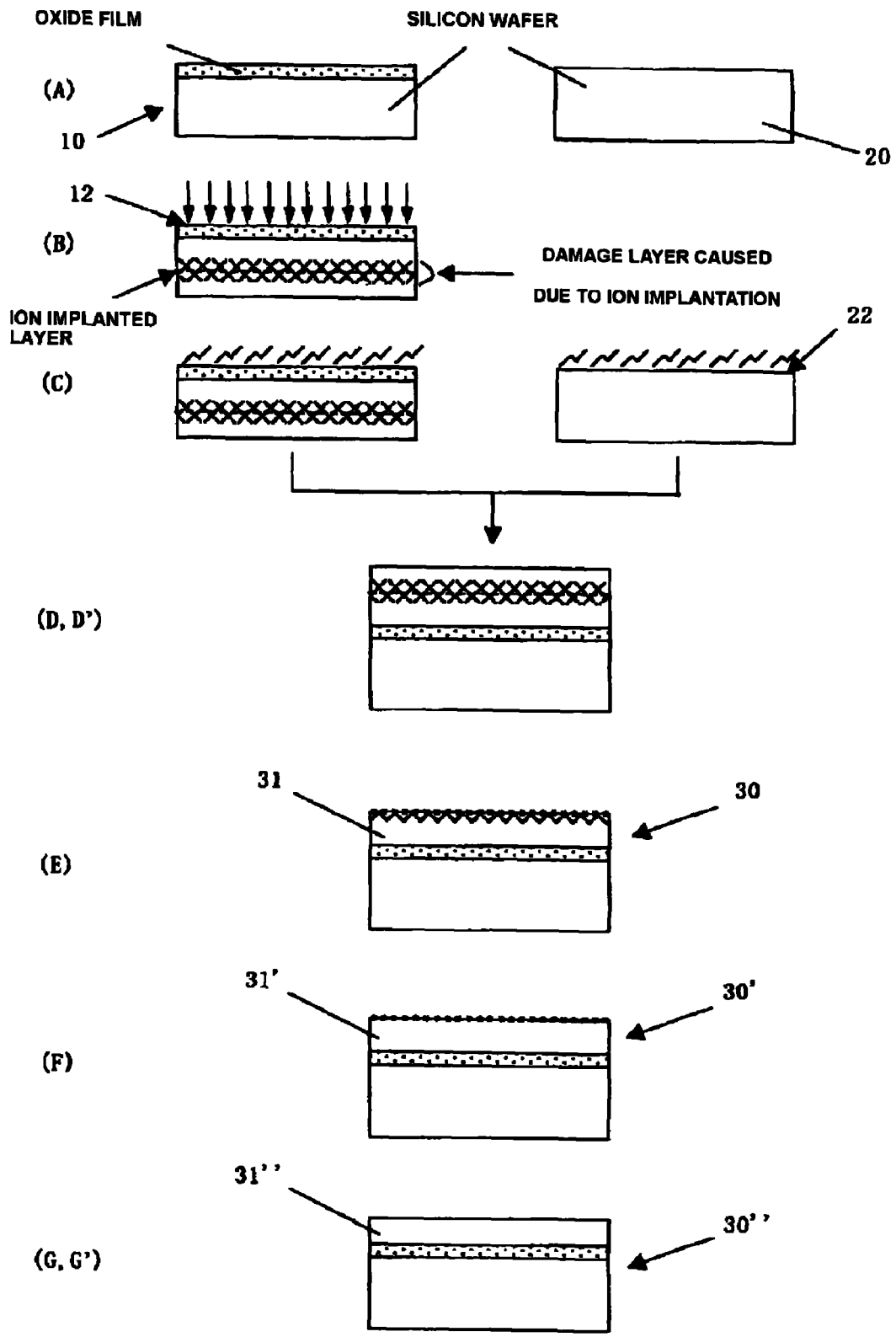
FIG. 1 is a process drawing showing an example of a process in a method for manufacturing an SOI wafer according to the present invention.

FIG. 1 is a process drawing showing an example of a process in a method for manufacturing an SOI wafer according to the present invention.

(Step A: Preparation of Donor Wafer and Handle Wafer)

First, as shown in FIG. 1(A), a donor wafer 10 formed of a silicon wafer having an oxide film formed on a surface thereof and a handle wafer 20 are prepared.

It is to be noted that an example where a silicon wafer having an oxide film formed on a surface thereof is used as the donor wafer 10 will be explained hereinafter, but the present invention is not restricted thereto, and a silicon wafer having no oxide film formed on a surface thereof can be used.

On the other hand, as the handle wafer 20, for example, it is possible to use any one of a silicon wafer, a silicon wafer having an oxide film formed on a surface thereof, a quartz wafer, a glass wafer, an alumina (sapphire) wafer, a SiC wafer, and an aluminum nitride wafer in this case.

Further, when a silicon wafer is used as the donor wafer 10, a silicon wafer having an oxide film formed on a surface thereof can be used as the handle wafer 20 in order to provide an SOI structure, for example.

The handle wafer 20 can be appropriately selected from the above-explained wafers in accordance with an object of a semiconductor device to be fabricated. Of course, any other material can be used. However, a combination of the donor wafer 10 and the handle wafer 20 must be a combination that enables finally forming the SOI structure (a structure where an SOI layer is formed on an insulator) by bonding.

Here, an example where a silicon wafer is used as the handle wafer 20 will be explained.

(Step B: Ion Implantation)

Subsequently, as shown in FIG. 1(B), hydrogen ions are implanted from a surface (an ion implanted surface) 12 of the donor wafer 10 to form an ion implanted layer.

When forming this ion implanted layer 11, not only the hydrogen ions but rare gas ions or both the hydrogen ions and the rare gas ions may be implanted. Other ion implantation conditions, e.g., an implantation energy, an implantation dose, an implantation temperature, and others can be appropriately selected so as to obtain a thin film having a predetermined thickness. As a specific example, a temperature of the wafer at the time of implantation is set to 250 to 350° C., an ion implantation depth is set to 0.5 µm, an implantation energy is set to 20 to 100 keV, and an implantation dose is set to $1 \times 10^{16}$ to $1 \times 10^{17}/cm^2$, but the present invention is not restricted thereto.

It is to be noted that, when a silicon wafer having a silicon oxide film formed on a surface thereof is used as the donor wafer 10 and an ion implantation is performed through the silicon oxide film, an effect of suppressing channeling of the implantation ion can be obtained, thereby further suppressing unevenness of an ion implantation depth. As a result, an SOI layer having higher film thickness uniformity can be formed.

(Step C: Plasma Activation Treatment)

Thereafter, as shown in FIG. 1(C), a plasma activation treatment is performed with respect to the ion implanted surface 12 of the donor wafer 10 and a surface 22 of the handle wafer 20 to be bonded.

Of course, the plasma activation treatment may be carried out with respect to one of the ion implanted surface 12 of the donor wafer 10 and the surface 22 of the handle wafer 20 to be bonded.

The surface subjected to the plasma activation treatment is activated. For example, OH groups of this surface are increased. Therefore, when the ion implanted surface 12 of the donor wafer is closely bonded to the surface 22 of the handle wafer to be bonded, these wafers can be further firmly bonded to each other based on, e.g., hydrogen bonding.

In the plasma activation treatment, a processing target wafer subjected to cleaning, e.g., RCA cleaning is put in a vacuum chamber, a gas for plasma treatment is introduced, and then the wafer is exposed to a high-frequency plasma of approximately 100 W for approximately 5 to 30 seconds to perform a plasma treatment with respect to a surface thereof. As the gas for plasma treatment, it is possible to use an oxygen gas when processing a single-crystal silicon wafer having an oxide film formed on a surface thereof, or a hydrogen gas, an argon gas, a mixed gas of these gases, or a mixed gas of the hydrogen gas and a helium gas when processing a single-crystal silicon wafer having no oxide film formed on a surface thereof. Further, a nitrogen gas as an inert gas may be used.

(Step D: Bonding of Donor Wafer and Handle Wafer)

Then, as shown in FIG. 1(D), the ion implanted surface 12 of the donor wafer 10 is closely bonded to the surface 22 of the handle wafer 20 to be bonded.

When the surface subjected to the surface activation treatment is determined as a surface to be bonded and the wafers are closely bonded to each other under a reduced pressure or a normal pressure at a room temperature in this manner, both the wafers can be sufficiently firmly bonded to each other so that they can resist subsequent mechanical delamination even if a high-temperature treatment is not performed.

(Step D': Bonding Heat Treatment)

Incidentally, it is good enough to carry out a heat treatment step of performing a heat treatment with respect to the closely bonded wafers at 400° C. or below after the step of closely bonding the donor wafer 10 to the handle wafer 20.

When the closely bonded wafers are subjected to the heat treatment at 400° C. or below, e.g., 100 to 400° C. after the donor wafer 10 and the handle wafer 20 are closely bonded to each other in this manner, bonding strength of the donor wafer 10 and the handle 20 wafer can be increased. In particular, when a heat treatment temperature is 100 to 300° C., a possibility of occurrence of thermal strain, cracks, delamination, and others due to a difference between thermal expansion coefficients is low even if different material types of wafers are bonded to each other. Increasing the bonding strength enables reducing occurrence of failures at the delamination step.

Furthermore, when such a heat treatment at a low temperature is carried out, since small cavities called micro cavities are not produced in the ion implanted interface as different from thermal delamination of the Smartcut method, surface roughness is not considerably increased in the surface of the SOI layer formed by mechanically delaminating a part of the donor wafer at the next step.

(Step E: Mechanical Delamination of Donor Wafer)

Subsequently, as shown in FIG. 1(E), a mechanical external force is applied to the bonded wafers to delaminate a part of the donor wafer 10, and a film thickness of the donor wafer 10 is reduced to provide the SOI layer 31.

For example, the donor wafer 10 and a back surface of the handle wafer 20 (the back surface is a surface opposite to the surface to be bonded) are held by holding jigs, an external impact shock is given to a position near the ion implanted layer by, e.g., a wedge-shaped member or a high-pressure fluid such as air, a nitrogen gas, or pure water to start delamination of the donor wafer 10 while applying a force that can separate both the holding jigs from each other, and both the holding jigs are relatively separated from each other. Consequently, the donor wafer 10 is gradually separated from the handle wafer 20 at the ion implanted layer from one end portion to which the external impact shock has been given toward the other end portion, thereby delaminating the donor wafer 10.

As explained above, in the present invention, the donor wafer 10 is first mechanically delaminated to reduce the film thickness thereof, thereby fabricating an SOI wafer 30 having an SOI layer 31. In the SOI layer 31 in the thus fabricated SOI wafer 30, since a delamination mechanism is different from thermal delamination based on the Smartcut method, surface roughness of the surface of the SOI layer 31 immediately after delamination can be suppressed to 50 nm or below in terms of a PV value, and the smooth surface can be obtained. That is, a polishing stock removal (an etching removal) in chemical mechanical polishing at a subsequent step G (or a GCIB processing at a step G') can be minimized, thereby it is possible to suppress film thickness uniformity of the SOI layer from being considerably degraded due to, e.g., polishing.

On the other hand, in thermal delamination based on the Smartcut method, a difference of elevation of approximately 65 nm in terms of the PV value occurs in a region of 1×1 μm, and it can be considered that a difference of elevation that is 100 nm or above occurs in the entire wafer region. That is, a thickness that must be removed by, e.g., polishing is increased, and uniforming a film thickness of the final SOI layer in a radial direction is difficult.

(Step F: Heat Treatment for Recovering Damage due to Ion Implantation)

Further, a heat treatment at 600 to 1000° C. is performed with respect to the SOI wafer 30 fabricated by effecting mechanical delamination as explained above. Consequently, as shown in FIG. 1(F), an SOI wafer 30' having an SOI layer 31' in which a damage due to ion implantation is improved is obtained.

A damage layer caused due to ion implantation effected at the step B (ion implantation) is formed in the SOI layer 31 immediately after delamination. For example, Science of SOI, Chapter 2, Realize corporation discloses that a damage layer due to ion implantation spreads for approximately 0.12 μm from a delamination interface (i.e., a surface of an SOI layer) in the SOI layer immediately after delamination. Such a damage serves as a factor of occurrence of a crystal defect, thereby possibly resulting in degradation of device characteristics. Therefore, the damage layer due to ion implantation needs to be recovered Thus, in the present invention, this damage is reduced and the damage layer due to ion implantation is recovered by effecting the heat treatment after delamination. Incidentally, it can be considered that a surface roughness of the SOI layer can be improved to some extent by this heat treatment.

At this time, setting a heat treatment temperature to 600° C. or above enables recovering the damage layer due to ion implantation. When the heat treatment temperature is lower than this value, reducing the damage is difficult, and the damage layer due to ion implantation remains even after the heat treatment.

On the other hand, when the heat treatment temperature is set to 1000° C. or below, heavy metal contamination from a heat treatment furnace can be avoided. Furthermore, since the heat treatment temperature is not set to a high temperature beyond necessity, an undue increase in cost can be avoided.

Moreover, even if, e.g., a quartz wafer whose glass-transition temperature is close to 1050° C. is used as the handle wafer, since the heat treatment temperature is 1000° C. or below, the heat treatment can be performed.

It is to be noted that an inert gas atmosphere of, e.g., argon or a mixed gas atmosphere containing this inert gas and hydrogen can be used as an atmosphere of this heat treatment.

Additionally, the heat treatment furnace to be used is not restricted in particular, and a furnace using a resistance heater, a furnace based on lamp heating (a rapid heating/rapid cooling device) and so on can be utilized, for example. Adopting the rapid heating/rapid cooling device enables efficiently performing the heat treatment in a short time.

(Step G: Chemical Mechanical Polishing)

Then, respect to the SOI wafer 30' having the thus recovered damage layer due to ion implantation, the surface of the SOI layer 31' is polished for 10 to 50 nm based on a chemical mechanical polishing method (a CMP method). Consequently, as shown in FIG. 1(G), an SOI wafer 30" having a mirror-finished surface of an SOI layer 31" can be obtained.

Figure 2:
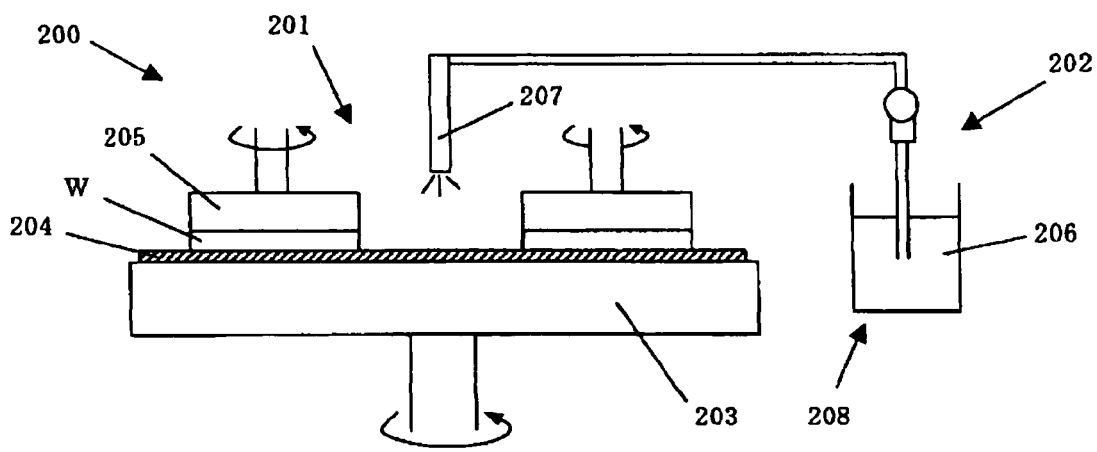
FIG. 2 is a schematic view showing an example of a CMP device.

FIG. 2 shows an outline of an example of a general CMP device. This CMP device 200 is formed of a main body 201 where polishing is carried out and a polishing slurry supply mechanism 202.

A discoid polishing turn table 203 is horizontally arranged in the main body 201. A polishing pad 204 is attached to an upper surface of the polishing turn table 203. A polishing head 205 that gives a polishing pressure while holding a processing target wafer W and a nozzle 207 that supplies a polishing slurry 206 are provided above the polishing pad 204 in a vertical direction. The polishing turn table 203 and the polishing head 205 are individually rotated and driven by, e.g., a motor.

Additionally, a tank 208 storing the polishing slurry 206 or a pump that adjusts a flow volume of the polishing slurry 206 is arranged in the polishing slurry supply mechanism 202 so that the polishing slurry 206 can be supplied from the tank 208 to the polishing pad 204 through the nozzle 207.

It is to be noted that a nonwoven fabric impregnated with an urethane resin, urethane foam can be used as the polishing pad 204 and so on, for example. Further, as the polishing slurry 206, an alkaline aqueous solution in which colloidal silica is dispersed can be used.

The polishing pad 204, the polishing slurry 206, and other mechanisms are not restricted in particular, and the same members as those in conventional examples can be used. They can be appropriately selected in accordance with, e.g., polishing conditions.

By using such a CMP device 200, in a state where a processing target wafer W (the SOI wafer 30') is held by the polishing head 205 and a state where the polishing head 205 and the polishing turn table 203 are rotated in the same direction within a horizontal plane, the processing target wafer W is pressed against the polishing pad 204 impregnated with the polishing slurry 206. As a result, the wafer W and the polishing pad 204 relatively move, thereby polishing the surface of the SOI layer 31' in the SOI wafer 30'.

It is to be noted that polishing conditions, e.g., a load on the SOI wafer 30' at the time of polishing or a flow volume of the polishing slurry 206 can be appropriately determined in accordance with an object, and they are not restricted in particular.

However, a stock removal of the SOI layer 31' to be polished falls within the rage of 10 to 50 nm.

Setting a polishing stock removal at the step G (chemical mechanical polishing) to the range of 10 to 50 nm will now be explained in detail.

In the present invention, as explained above, when the donor wafer 10 is delaminated to provide the SOI layer 31 at the step E (mechanical delamination of the donor wafer), mechanical delamination rather than thermal delamination is performed. Therefore, the SOI layer having the relatively smooth surface can be obtained. Therefore, in the present invention, roughness of the surfaces of the SOI layer 31 immediately after delamination and the SOI layer 31' after the heat treatment at the step F (the heat treatment for recovering the damage due to ion implantation) is considerably smaller than that produced when thermal delamination like the Smartcut method is carried out. And when effecting chemical mechanical polishing at this step G, it is possible to reduce the polishing stock removal sufficiently and to set to 50 nm or below. However, polishing must be of course performed to some extent when realizing a mirror-finished surface, and polishing for specifically 10 nm or above must be effected.

When the surface of the SOI layer 31' is subjected to chemical mechanical polishing in such a polishing stock removal range, a mirror surface level equivalent to a surface of a regular polished wafer (for example, an RMS value indicative of a surface roughness is 0.5 nm or below) can be obtained. Further, the polishing stock removal is 50 nm or below as different from that in conventional examples (a polishing stock removal of 100 nm or above is required when thermal delamination is carried out), thus considerably reducing degradation in film thickness uniformity of the SOI layer 31" after polishing.

For example, in conventional examples, when a film thickness of a final SOI layer is 100 nm, a polishing stock removal is 150 nm and unevenness in a radial direction of polishing due to, e.g., a polishing device is ±10%, a film thickness of an SOI layer obtained after polishing is 85 to 115 nm, and a film thickness unevenness is 30%. Furthermore, when the polishing stock removal is 100 nm, a film thickness of the SOI layer obtained after polishing is 90 to 110 nm, and a film thickness unevenness is 20%.

On the other hand, in the present invention, since the polishing stock removal is 50 nm at a maximum, a film thickness of the SOI layer obtained after polishing is 95 to 105 nm, thereby suppressing a film thickness unevenness to 10% or below.

Furthermore, since the polishing stock removal is minimized in this manner, a cost or a time required for polishing can be reduced.

According to the method for manufacturing an SOI wafer of the present invention, the donor wafer 10 is mechanically delaminated, then the heat treatment at 600 to 1000° C. is performed, and the surface of the SOI layer is polished for 10 to 50 nm based on chemical mechanical polishing. As a result, the surface of the SOI layer can be mirror-finished while very effectively preventing film thickness uniformity of the SOI layer from being degraded, and the high-quality SOI wafer 30" can be manufactured with high productivity without requiring high cost.

Meanwhile, besides the example using chemical mechanical polishing as explained above, the method for manufacturing an SOI wafer according to the present invention using the GCIB processing also enables manufacturing the same high-quality SOI wafer. This method for manufacturing an SOI wafer using the GCIB processing will now be explained hereinafter.

First, in this method for manufacturing an SOI wafer, a step A (preparation of a donor wafer and a handle wafer) to a step F (a heat treatment for recovering an ion implantation damage) can be the same as those in the method for manufacturing an SOI wafer using chemical mechanical polishing (see FIG. 1).

(Step G': GCIB Processing)

Further, the GCIB processing is then used to etch a surface of an SOI layer for 10 to 50 nm.

Figure 3:
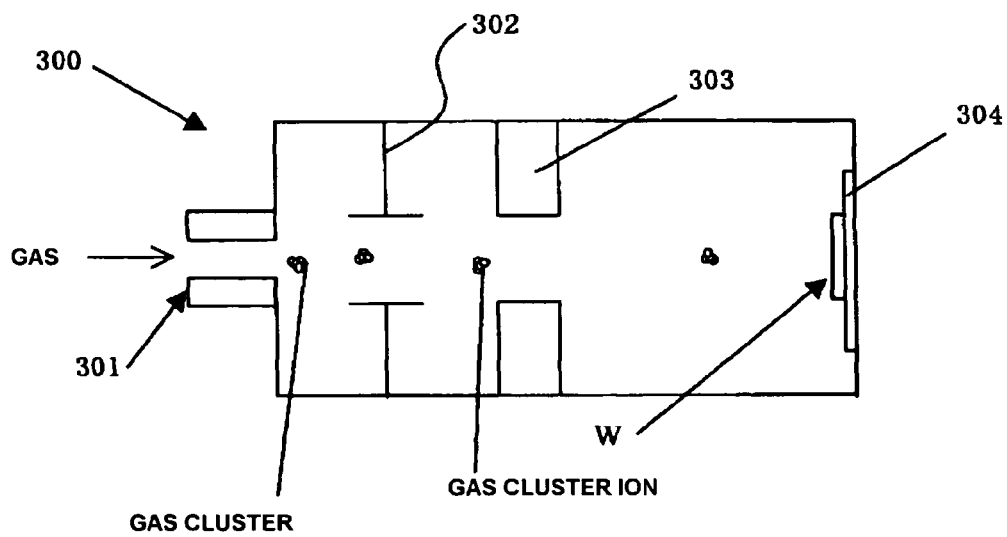
FIG. 3 is a schematic view showing an example of a GCIB processing device.

FIG. 3 shows an outline of an example of a general GCIB processing device. This GCIB processing device 300 is mainly formed of a gas cluster (a massive atom cluster) generating section 301 into which a raw material gas is introduced to cause adiabatic expansion in a vacuum, an ionizing electrode 302 that ionizes a gas cluster, and an accelerating electrode 303 that accelerates a gas cluster ion by using an accelerating voltage. Furthermore, a mechanism 304 that holds a processing target wafer W is provided at a position facing the gas cluster generating section 301. Besides, a pump (not shown) for discharge is provided.

In this manner, the GCIB processing device 300 that can be used in the present invention is not restricted in particular, and it can be the same as a device used in conventional examples.

With use of such a GCIB processing device 300, a gas cluster is generated in the generating section 301, electrons are applied to the gas cluster to provide a gas cluster ion, the gas cluster ion is accelerated by the accelerating voltage, and a surface of the processing target wafer W held by the holding mechanism 304 is irradiated with the gas cluster ion.

The gas cluster ion that has struck on the surface of the processing target wafer W, i.e., the massive atom cluster collapses and flows along the surface of the processing target wafer W to etch the surface of the processing target wafer W.

It is to be noted that $SF_6$ and the like can be used as the raw material gas, for example. Moreover, conditions for a current applied to the ionizing electrode 302, a voltage applied to the accelerating electrode 303 and so on are not restricted in particular, and they can be appropriately determined so as to obtain desired etching conditions.

However, a thickness of the SOI layer to be etched falls within the range of 10 to 50 nm, such an etching removal range enables obtaining a mirror surface level equivalent to that of a regular polished wafer like the example of chemical mechanical polishing without degrading film thickness uniformity of the SOI layer.

That is, it is possible to obtain such an SOI wafer 30" as depicted in FIG. 1(G) having the SOI layer 31" with a mirror-finished surface and excellent film thickness uniformity.

Additionally, after the GCIB processing, the surface of the SOI layer can be also polished for a minimum amount (e.g., 10 to 30 nm) based on chemical mechanical polishing as required in order to facilitating mirror finish of the surface of the SOI layer.

EXAMPLE

The method for manufacturing an SOI wafer according to the present invention will now be further specifically explained based on examples and comparative examples.

Examples 1 to 6 and Comparative Examples 1 to 5

A silicon wafer having a diameter of 150 mm was prepared as a donor wafer, and a silicon oxide film with a thickness of 100 nm was formed on a surface of this wafer based on thermal oxidation. A hydrogen ion was implanted into this wafer through the silicon oxide film to form an ion implanted layer. As ion implantation conditions, an implantation energy was 35 keV, an implantation dose was $9 \times 10^{16}/cm^2$, and an implantation depth was appropriately adjusted in accordance with a polishing stock removal at a subsequent chemical mechanical polishing step (or an etching stock removal at a GCIB processing step).

Further, a silicon wafer having a diameter of 150 mm was prepared as a handle wafer.

Subsequently, a plasma treatment device was used to introduce a nitrogen gas as a gas for plasma treatment, thereby performing a surface activation treatment with respect to an ion implanted surface of the prepared donor wafer and a surface of the handle wafer.

Furthermore, these wafers were bonded to each other at a room temperature and subjected to a heat treatment at 300° C. for 30 minutes, and then a part of the donor wafer was mechanically delaminated at the ion implanted layer as a boundary to fabricate an SOI wafer having an SOI layer formed on the surface of the handle wafer.

This SOI wafer was subjected to a heat treatment for 30 minutes in a mixed atmosphere containing argon and hydrogen in various heat treatment temperatures.

Moreover, the CMP device shown in FIG. 2 was used to polish a surface of the SOI layer based on chemical mechanical polishing in various polishing stock removals.

Urethane foam was used as a polishing pad, and an alkaline aqueous solution having colloidal silica dispersed therein was used as a polishing slurry.

Additionally, an SOI wafer having the SOI layer with a film thickness of 100 nm was finally obtained through these steps.

It is to be noted that conditions for the heat treatment temperature and the polishing stock removal are as follows.

Example 1: 600° C. as a heat treatment temperature, nm as a polishing stock removal Example 2: 600° C. as a heat treatment temperature, nm as a polishing stock removal Example 3: 600° C. as a heat treatment temperature, nm as polishing stock removal Example 4: 980° C. as a heat treatment temperature, 10 nm as a polishing stock removal Example 5: 980° C. as a heat treatment temperature, 30 nm as a polishing stock removal Example 6: 980° C. as a heat treatment temperature, 50 nm as a polishing stock removal Comparative Example 1: 550° C. as a heat treatment temperature, 30 nm as a polishing stock removal Comparative Example 2: 1050° C. as a heat treatment temperature, 30 nm as a polishing stock removal Comparative Example 3: 600° C. as a heat treatment temperature, 5 nm as a polishing stock removal Comparative Example 4: 600° C. as a heat treatment temperature, 60 nm as a polishing stock removal Comparative Example 5: 1100° C. as a heat treatment temperature, 100 nm as a polishing stock removal Surface roughness and film thickness uniformity of the SOI layer in each of the thus manufactured SOI wafers were examined. In each of Examples 1 to 6 where the heat treatment temperature falls within the range of 600 to 1000° C. and the polishing stock removal falls within the range of 10 to 50 nm, an RMS value indicative of a surface roughness of the SOI layer was reduced to 0.5 nm or below to realize sufficient mirror finish, and a film thickness of the SOI layer in a radial direction was in the range of 95 to 105 nm, thereby suppressing a film thickness unevenness to 10% or below.

Further, examining damages in the SOI layer due to ion implantation, these damages were removed.

As explained above, in each of Examples 1 to 6 embodying the present invention, the high-quality SOI wafer suitable for fabrication of a device was obtained.

On the other hand, as different from the present invention, in Comparative Example 1 where the heat treatment temperature is less than 600° C., damages caused due to ion implantation remained, resulting in occurrence of a crystal defect due to the damages.

Further, in each of Comparative Examples 2 and 5 where the heat treatment temperature exceeds 1000° C., a cost was increased beyond necessity, and productivity was lowered. Furthermore, metal contamination occurred in the SOI layer.

Moreover, in Comparative Example 3 where a polishing stock removal is less than 10 nm, it can be considered that a polishing amount for the surface of the SOI layer was not enough, an RMS value indicative of roughness was 0.1 nm, and sufficient mirror finish was not realized.

Additionally, in each of Comparative Examples 4 and 5 where a polishing stock removal exceeds 50 nm, the surface of the SOI layer was mirror-finished, but a film thickness of this layer was deteriorated. The film thickness was 92 to 107 nm in Comparative Example 4 and it was 90 to 112 nm in Comparative example 5, film thickness unevenness in both the comparative examples exceeded 10%, and it was revealed that film thickness uniformity was inferior to that in each Example.

As explained above, the SOI wafer according to each of Comparative Examples 1 to 5 has the extremely high cost which is not realistic, or it was not suitable for fabrication of a device.

Comparative Example 6

An SOI wafer was manufactured by performing a heat treatment and chemical mechanical polishing after delamination, and the hear treatment and chemical mechanical polishing method based on the same procedure as those of Example 1 except that a donor wafer was thermally delaminated by effecting a heat treatment at 500° C. for 30 minutes. An RMS value indicative of a surface roughness of an SOI layer was 1.4 nm, and this surface was not mirror-finished. It can be considered that micro cavities were produced in an ion implanted interface (the surface of the SOI layer) since the donor wafer was delaminated based on the heat treatment at a temperature exceeding 400° C., the surface of the SOI layer immediately after delamination was rough as compared with those in Examples 1 to 6 adopting mechanical delamination, and the surface roughness was not able to be sufficiently reduced.

As explained above, like the method for manufacturing an SOI wafer of the present invention, it can be understood that the high-quality SOI wafer having the SOI layer with the mirror-finished surface and good film thickness uniformly can be produced without increasing a cost beyond necessity only after the donor wafer is mechanically delaminated and subjected to the heat treatment at 600 to 1000° C. and the surface of the SOI layer is polished for 10 to 50 nm based on chemical mechanical polishing.

Examples 7 to 12

An SOI wafer was manufactured like Examples 1 to 6 except that a surface of an SOI layer was etched for 10 to 50 nm based on a GCIB processing in place of chemical mechanical polishing after a heat treatment following delamination.

$SF_6$ was used as a raw material gas, a cluster size was 1000 atoms or above, a current applied to an ionizing electrode was 300 μA, and a voltage applied to an accelerating electrode was 30 kV.

Examining the SOI layer of the thus obtained SOI wafer, it was revealed that the high-quality SOI layer having a mirror-finished surface and a uniform film thickness was obtained like Examples 1 to 6.

It is to be noted that the present invention is not restricted to the foregoing examples. The examples are just exemplifications, and any examples which have the same structure and demonstrate the same functions and effects as those in the technical concept explained in claims of the present invention are included in the technical scope of the present invention.

For example, although the silicon wafer was used as the handle wafer in the foregoing examples, a quartz wafer, a glass wafer, an alumina (sapphire) wafer, a SiC wafer, or an aluminum nitride wafer can be also used as the handle wafer.

What is claimed is:

1. A method for manufacturing an SOI wafer comprising at least:

implanting a hydrogen ion, a rare gas ion, or both the ions into a donor wafer formed of a silicon wafer or a silicon wafer having an oxide film formed on a surface thereof from a surface of the donor wafer, thereby forming an ion implanted layer;

performing a plasma activation treatment with respect to at least one of an ion implanted surface of the donor wafer and a surface of a handle wafer, wherein the handle wafer is a SiC wafer or an aluminum nitride wafer, and wherein the surface of the handle wafer is to be bonded to the ion implanted surface;

closely bonding the ion implanted surface of the donor wafer to the surface of the handle wafer;

delaminating the donor wafer only mechanically without performing a heat treatment at the ion implanted layer as a boundary and thereby reducing a film thickness thereof to provide an SOI layer, and subsequently performing a heat treatment at 600 to 1000° C.;

etching a surface of the SOI layer for 10 to 50 nm based on a GCIB processing; and then polishing the surface of the SOI layer after the GCIB processing for 10 to 30 nm based on chemical mechanical polishing.

2. The method for manufacturing an SOI wafer according to claim 1, wherein an RMS value indicative of a surface roughness of the SOI layer after the GCIB processing is set to 0.5 nm or below.

* * * * *